(12) United States Patent
Lim

(10) Patent No.: US 7,167,049 B2
(45) Date of Patent: Jan. 23, 2007

(54) OP-AMPLIFIER WITH AN OFFSET VOLTAGE CANCELLATION CIRCUIT

(75) Inventor: Kyu-Tae Lim, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 93 days.

(21) Appl. No.: 10/998,372

(22) Filed: Nov. 29, 2004

(65) Prior Publication Data

US 2005/0174174 A1    Aug. 11, 2005

(30) Foreign Application Priority Data

Feb. 10, 2004  (KR) ...................... 10-2004-0008647

(51) Int. Cl.
*H03F 3/45*    (2006.01)
(52) U.S. Cl. ...................... 330/253; 330/257; 330/260; 330/261
(58) Field of Classification Search ...................... None
See application file for complete search history.

(56) References Cited

U.S. PATENT DOCUMENTS

| | | | |
|---|---|---|---|
| 6,052,025 A * | 4/2000 | Chang et al. ................ | 330/258 |
| 6,107,882 A * | 8/2000 | Gabara et al. .............. | 330/258 |
| 6,388,522 B1 * | 5/2002 | Fattaruso et al. ........... | 330/258 |

FOREIGN PATENT DOCUMENTS

| | | |
|---|---|---|
| JP | 04-040108 | 2/1992 |
| JP | 04-097608 | 3/1992 |
| JP | 04-271607 | 9/1992 |
| JP | 00-031824 | 1/2000 |
| KR | 99-038009 | 6/1999 |
| KR | 1020010090703 A | 10/2001 |

OTHER PUBLICATIONS

Kyu-Tae Lim, Thesis entitled "The TFT-LCD Data Output Driver With Offset Cancellation Circuit", Feb. 2004.
Kyu-Tae Lim et al., Abstract presentation "The TFT-LCD Data Output Driver With Offset Cancellation Circuit", 2003 IEEE Conference on Electron Devices and Solid State Circuits, Dec. 16-18, 2003.

\* cited by examiner

*Primary Examiner*—Khanh Van Nguyen
(74) *Attorney, Agent, or Firm*—F. Chau & Associates, LLC

(57) ABSTRACT

An OP-amplifier with an offset cancellation circuit is provided. The OP-amplifier includes: an input unit having a mirror circuit and first and second differential input circuits, the mirror circuit having first and second output terminals, the first differential input circuit having a first bias circuit and the second differential input circuit having a second bias circuit; an output unit for amplifying output signals of the first and second differential input circuits; and a differential mode feedback circuit for sensing a voltage difference between an output voltage and an input voltage applied to the first and the second differential input circuits, for outputting a first voltage and a second voltage based on the voltage difference, and for feeding back the first voltage to the first bias circuit and feeding back the second voltage to the second bias circuit to remove an offset voltage.

19 Claims, 6 Drawing Sheets

US 7,167,049 B2

OP-AMPLIFIER WITH AN OFFSET VOLTAGE CANCELLATION CIRCUIT

CROSS-REFERENCE TO RELATED APPLICATION

This application claims priority to Korean Patent Application No. 2004-8647, filed on Feb. 10, 2004, in the Korean Intellectual Property Office, the disclosure of which is incorporated herein in its entirety by reference.

FIELD OF THE INVENTION

The present invention relates to an OP-amplifier, and more particularly, to an OP-amplifier with an offset voltage cancellation circuit.

DESCRIPTION OF THE RELATED ART

FIG. 1 is a circuit diagram of a conventional OP-amplifier 100. Referring to FIG. 1, the conventional OP-amplifier 100 includes a bias circuit 102, an input unit 104 and an output unit 106. The bias circuit 102 includes transistors B1, B2 and B3, and a resistor R and provides a constant current to the input unit 104. The input unit 104 has a differential input structure consisting of three transistors of M1, M2 and M5, and a current mirror circuit consisting of two transistors of M3 and M4. The output unit 106 includes transistors M6 and M7, and capacitors Cc1 and $C_L$ and acts as a secondary amplifier for amplifying an output signal of the input unit 104.

In the conventional OP-amplifier 100, an offset voltage is generated due to a mismatch of the transistors M1 and M2. Accordingly, an output voltage of the input unit 104, which acts as a data driver, has a certain voltage offset. Such an offset voltage is typically about ±20 mV.

The conventional OP-amplifier 100 removes the offset voltage using a capacitor and a MOS switch in the output unit 106. However, because the capacitor occupies a large area and a sample offset is generated by the offset voltage as it is fed-through the MOS switch it is difficult to completely remove the offset voltage.

Further, an increased resolution of a thin film transistor-liquid crystal display (TFT-LCD) for driving integrated circuits (ICs) requires the conventional OP-amplifier 100 to be more accurately operated. Because an offset of the conventional OP-amplifier 100 is relatively small, an LCD IC including the conventional OP-amplifier 100 can be designed for use with certain high resolution applications. However, because the conventional OP-amplifier 100 still has a high offset voltage of, for example, ±20 mV, the conventional OP-amplifier 100 cannot be used as a data driver of a TFT-LCD for higher resolution applications employing, for example, a gray-scale of 10 bits.

SUMMARY OF THE INVENTION

According to an aspect of the present invention, there is provided an OP-amplifier comprising: an input unit having a mirror circuit and a pair of differential input circuits with an asymmetric structure wherein the mirror circuit has a first output terminal and a second output terminal and the pair of differential input circuits includes a first differential input circuit with a first bias circuit and a second differential input circuit with a second bias circuit; an output unit for amplifying output signals of the pair of differential input circuits of the input unit; and a differential mode feedback circuit for sensing a voltage difference between an output voltage and an input voltage applied to the first and the second differential input circuits of the input unit, for outputting a first voltage and a second voltage based on the voltage difference, and for feeding back the first voltage to the first bias circuit of the first differential input circuit and feeding back the second voltage to the second bias circuit of the second differential input circuit to remove an offset voltage.

A transconductance of a transistor connected to the first output terminal of the mirror circuit, among transistors of the first differential input circuit, is smaller than a transconductance of a transistor connected to the second output terminal of the mirror circuit, and a transconductance of a transistor connected to the first output terminal of the mirror circuit, among transistors of the second differential input circuit, is greater than a transconductance of a transistor connected to the second output terminal of the mirror circuit.

According to another aspect of the present invention, there is provided an OP-amplifier comprising: an input circuit including two differential amplifiers each with an asymmetric structure for sensing a difference between an input signal and an output signal, wherein each of the two differential amplifiers includes a current source; an output circuit for amplifying an output signal of the input circuit and for generating the amplified result as the output signal; and a differential mode feedback circuit for sensing a difference between the input signal and the output signal and for feeding back the sensed result to a current source of each of the two differential amplifiers of the input circuit to remove an offset voltage.

According to still another aspect of the present invention, there is provided an OP-amplifier comprising: a first differential amplifier including two transistors with an asymmetric structure and a first current source connected to a common node of the two transistors for sensing and amplifying a voltage difference between an input voltage and an output voltage; a second differential amplifier, connected in parallel to the first differential amplifier, including two transistors with an asymmetric structure and a second current source connected to a common node of the two transistors for sensing and amplifying a voltage difference between the input voltage and the output voltage; an output circuit for amplifying an output signal of a common connection node of the first differential amplifier and the second differential amplifier and for generating the amplified result as the output signal; and a differential mode feedback circuit for sensing and amplifying a difference between the input signal and the output signal and for outputting the amplified result through corresponding output terminals, wherein any one among the corresponding output terminals is connected to a control gate of the first current source and another one among the corresponding output terminals is connected to a control gate of the second current source.

BRIEF DESCRIPTION OF THE DRAWINGS

The above and other features of the present invention will become more apparent by describing in detail exemplary embodiments thereof with reference to the attached drawings, in which.

DETAILED DESCRIPTION OF EXEMPLARY EMBODIMENTS OF THE INVENTION

Figure 1:
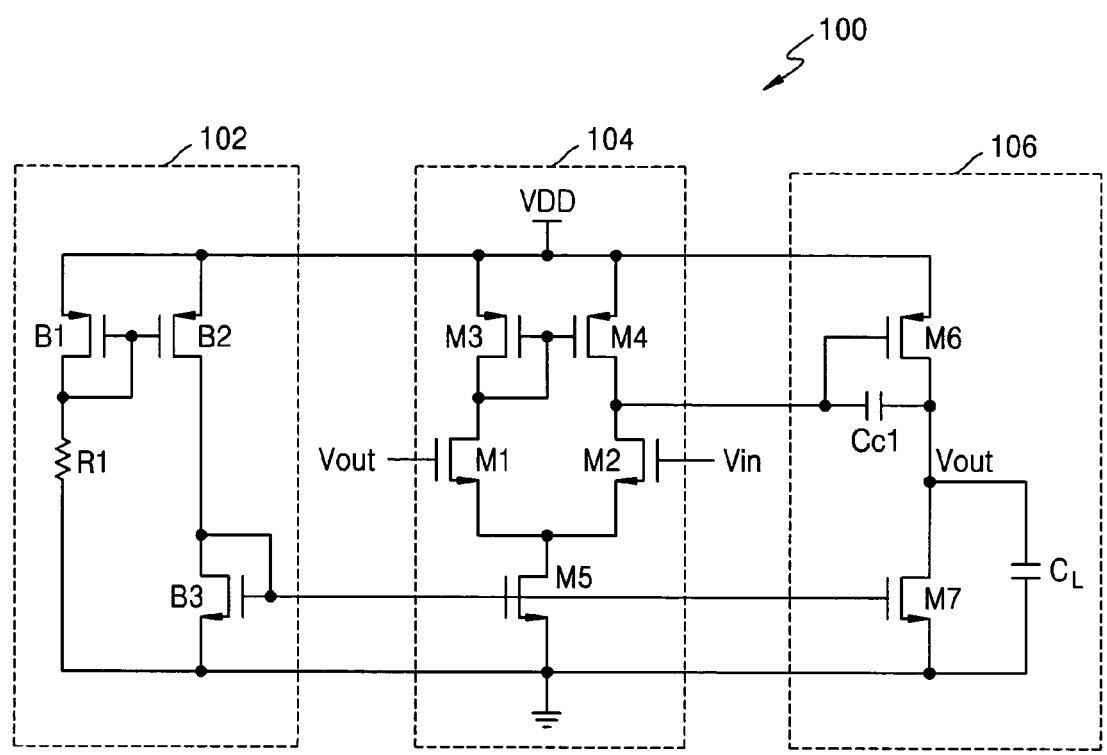
FIG. 1 is a circuit diagram of a conventional OP-amplifier.
Figure 2:
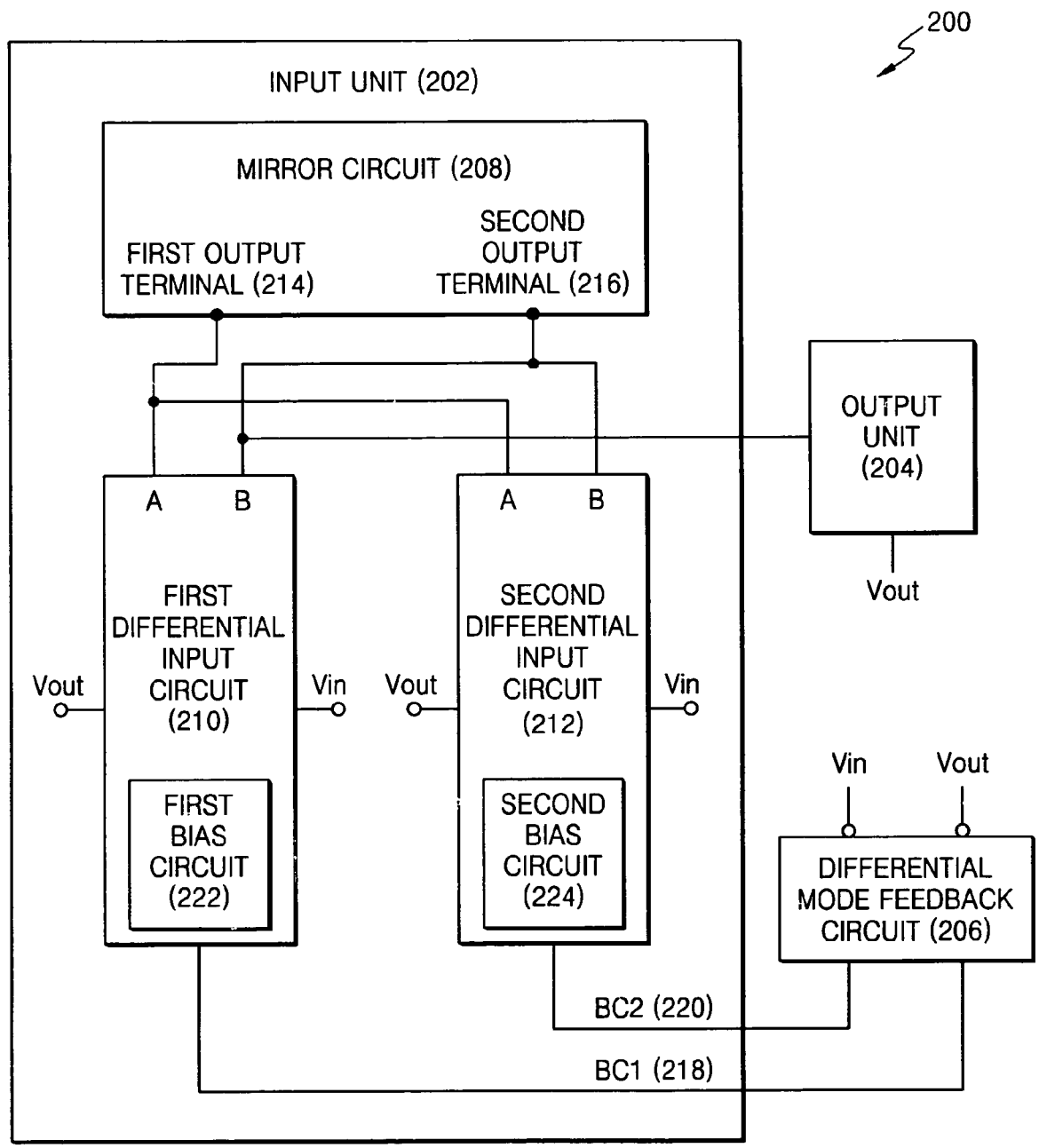
FIG. 2 is a block diagram of an OP-amplifier according to an exemplary embodiment of the present invention.

FIG. 2 is a block diagram of an OP-amplifier 200 according to an exemplary embodiment of the present invention. Referring to FIG. 2, the OP-amplifier 200 includes an input unit 202, an output unit 204, and a differential mode feedback circuit 206. The input unit 202 includes first and second differential input circuits 210 and 212 each with an asymmetric structure. The first and second differential input circuits 210 and 212 receive input/output voltages Vin and Vout of the OP-amplifier 200, and output a voltage corresponding to a voltage difference between the input voltage Vin and the output voltage Vout. The output unit 204 receives and amplifies the output voltage Vout of the input unit 202. The differential mode feedback circuit 206 senses a voltage difference between the input voltage Vin and the output voltage Vout applied respectively to the first and second differential input circuits 210 and 212 of the input unit 202, outputs first and second voltages (BC1) 218 and (BC2) 220 corresponding to the voltage difference, and feeds back the output voltage Vout respectively to bias circuits (not shown) of the first and second differential input circuits 210 and 212, thereby canceling a voltage offset.

The input unit 202 includes a mirror circuit 208 in addition to the first differential input circuit 210 and the second differential input circuit 212. The mirror circuit 208 includes a first output terminal 214 and a second output terminal 216 from which equal amounts of current are output respectively. The first output terminal 214 and the second output terminal 216 are connected to the first differential input circuit 210 and the second differential input circuit 212, respectively.

The first output terminal 214 of the mirror circuit 208 is connected to transistors (not shown) for sensing the output voltage Vout of the OP-amplifier 200 wherein the transistors are installed in the first and second differential input circuits 210 and 212. The second output terminal 214 of the mirror circuit 208 is connected to transistors (not shown) for sensing the input voltage Vin of the OP-amplifier 200 wherein the transistors are installed in the first and second differential input circuits 210 and 212.

The first differential input circuit 210 includes a first bias circuit 222 which is controlled according to the first voltage (BC1) 218 output from the differential mode feedback circuit 206. The second differential input circuit 212 includes a second bias circuit 224 which is controlled according to the second voltage (BC2) 220 output from the differential mode feedback circuit 206.

A transistor is connected to the first output terminal 214 of the mirror circuit 208 among the transistors of the first differential input circuit 210 and is smaller than a transistor connected to the second output terminal 216 of the mirror circuit 208. A transistor is connected to the first output terminal 214 of the mirror circuit 208 among the transistors of the second differential input circuit 212 is larger than a transistor connected to the second output terminal 216. Thus, the first and second differential input circuits 210 and 212 have asymmetric structures.

In addition, a transistor of the first differential input circuit 210 among the transistors connected to the first output terminal 214 of the mirror circuit 208 is smaller than a transistor of the second differential input circuit 212. A transistor of the first differential input circuit 210 among the transistors connected to the second output terminal 216 of the mirror circuit 208 is larger than a transistor of the second differential input circuit 212. Thus, the transistor of the first differential input circuit 210 and the transistor of the second differential input circuit 212, which are connected in parallel to the respective output terminals 214 and 216 of the mirror circuit 208, have asymmetric structures.

The differential mode feedback circuit 206 receives the output voltage Vout and the input voltage Vin of the OP-amplifier 200, senses a voltage difference between the input and output voltages Vin and Vout, and outputs the voltages (BC1) 218 and (BC2) 220 corresponding to the voltage difference. The first output voltage (BC1) 218 controls the first bias circuit 222 of the first differential input circuit 210 and the second output voltage (BC2) 212 controls the bias circuit 224 of the second differential input circuit 212.

Figure 3:
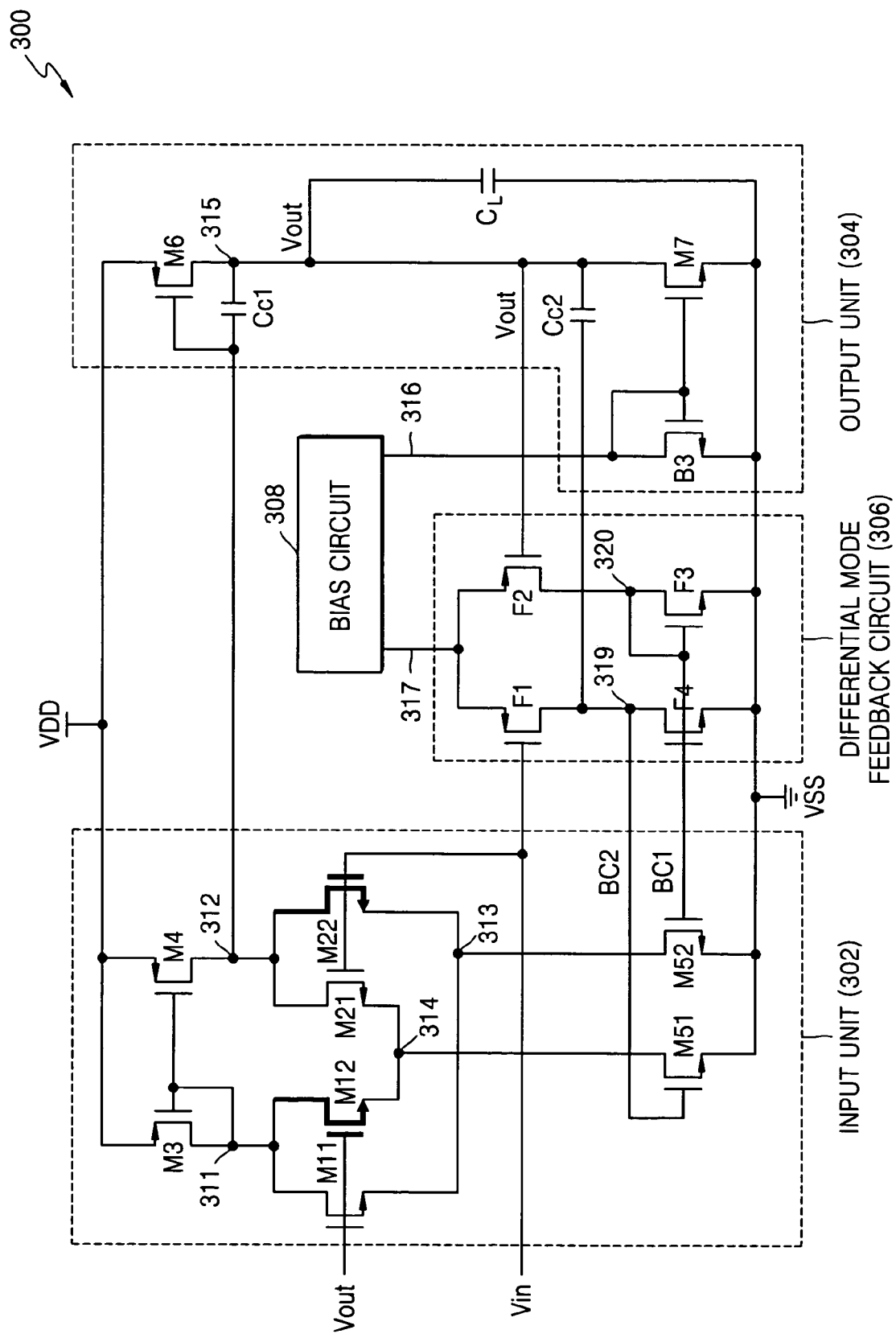
FIG. 3 is a circuit diagram of an OP-amplifier according to another exemplary embodiment of the present invention.
Figure 4:
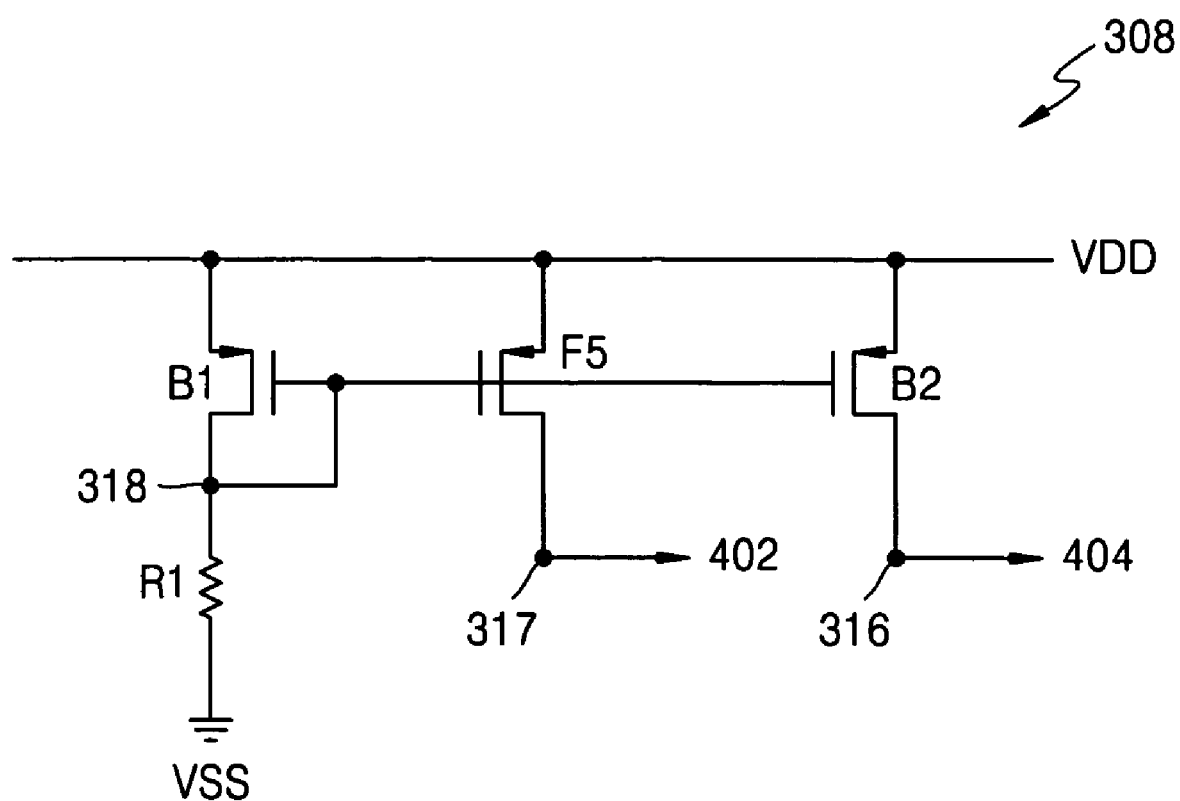
FIG. 4 is a circuit diagram of an internal bias circuit of the OP-amplifier shown in FIG. 3.

FIG. 3 is a circuit diagram of an OP-amplifier 300 according to another exemplary embodiment of the present invention. FIG. 4 is a circuit diagram of an internal bias circuit 308 of the OP-amplifier shown in FIG. 3.

Referring to FIG. 3, the OP-amplifier 300 includes an input unit 302, an output unit 304, a differential mode feedback circuit 306, and the internal bias circuit 308. The input unit 302 of the OP-amplifier 300 includes a first transistor M3 connected between a supply voltage VDD and a first node 311, a second transistor M4 connected between the supply voltage VDD and a second node 312, a third transistor M11 connected between the first node 311 and a third node 313, a fourth transistor M12 connected between the first node 311 and a fourth node 314, a fifth transistor M21 connected between the second node 312 and the fourth node 314, a sixth transistor M22 connected between the second node 312 and the third node 313, a seventh transistor M51 connected between the fourth node 314 and a ground voltage VSS, and an eighth transistor M52 connected between the third node 313 and the ground voltage VSS.

In the input unit 302, gates of the first transistor M3 and the second transistor M4 are connected to the first node 311. An output voltage Vout of the OP-amplifier 300 is applied to gates of the third transistor M11 and the fourth transistor M12. An input voltage Vin of the OP-amplifier 300 is applied to gates of the fifth transistor M21 and the sixth transistor M22. A second differential output voltage BC2 of the differential mode feedback circuit 306 is applied to a gate of the seventh transistor M51. A first differential output voltage BC1 of the differential mode feedback circuit 306 is applied to a gate of the eighth transistor M52.

The first and second transistors M3 and M4 of the input unit 302 form a mirror circuit, the third transistor M11, the sixth transistor M22 and the eighth transistor M52 form a first differential input circuit, and the fourth transistor M12, the fifth transistor M21 and the seventh transistor M51 form a second differential input circuit. Here, the eighth transistor M52 also forms a bias circuit of the first differential input circuit and the seventh transistor M51 forms a bias circuit of the second differential input circuit.

In addition, the third transistor M11 and the fifth transistor M21 of the input unit 302 have the same current flow characteristics, and the fourth transistor M12 and the sixth transistor M22 have the same current flow characteristics.

However, the fourth transistor M12 and the fifth transistor M21 have different current flow characteristics and the third transistor M11 and the sixth transistor M22 have different current flow characteristics. That is, the third and fifth transistors M11 and M21 are smaller than the fourth and sixth transistors M12 and M22 thus an amount of current flowing to the third and fifth transistors M11 and M21 is less than an amount of current flowing to the fourth and sixth transistors M12 and M22. Therefore, a transconductance (gm) of the third and fifth transistors M11 and M21 is smaller than that of the fourth and sixth transistors M12 and M22.

The output unit 304 of the OP-amplifier 300 includes a ninth transistor M6 connected between the supply voltage VDD and a fifth node 315, a first capacitor Cc1 connected between the second node 312 and the fifth node 315, a second capacitor CL and a tenth transistor M7 connected in parallel between the fifth node 315 and the ground voltage VSS, an eleventh transistor B3 connected between a sixth node 316 and the ground voltage VSS, and a third capacitor Cc2 connected between the fifth node 315 and a gate of the seventh transistor M51 of the input unit 302

In addition, gates of the ninth transistor M6 of the output unit 304 are connected to the second node 312, gates of the tenth transistor M7 and the eleventh transistor B3 are connected to the sixth node 316, and the output voltage Vout of the OP-amplifier 300 is applied to the fifth node 315.

The OP-amplifier 300 further includes an internal bias circuit 308 as further illustrated in FIG. 4. As shown in FIG. 4, the internal bias circuit 308 has two output terminals 402 and 404 connected to the sixth node 316 and the seventh node 317 respectively, a twelfth transistor B1 connected to the supply voltage VDD and an eighth node 318, a thirteenth transistor F5 connected to the supply voltage VDD and the seventh node 317, and a fourteen transistor B2 connected to the supply voltage VDD and the sixth node 316.

Further, gates of the twelfth transistor B1, the thirteenth transistor F5 and the fourteenth transistor B2 in the internal bias circuit 308 are connected respectively to the eighth node 318.

Referring back to FIG. 3, the differential mode feedback circuit 306 of the OP-amplifier 300 includes a fifteenth transistor F1 connected between the seventh node 317 and a ninth node 319, a sixteenth transistor F2 connected between the seventh node 317 and a tenth node 320, a seventeenth transistor F4 connected between the ninth node 319 and the ground voltage VSS, and an eighteenth transistor F3 connected between the tenth node 320 and the ground voltage VSS.

In addition, the input voltage Vin of the OP-amplifier 300 is applied to a gate of the fifteenth transistor F1 of the differential mode feedback circuit 306, the output voltage Vout of the OP-amplifier 300 is applied to a gate of the sixteenth transistor F2, gates of the seventeenth transistor F4 and the eighteenth transistor F3 are connected to the tenth node 320, the ninth node 319 is connected to a gate of the seventh transistor M51 of the input unit 302, and the tenth node 320 is connected to a gate of the eighth transistor M52 of the input unit 302.

The first and second transistors are positive channel metal oxide semiconductor (PMOS) transistors, and the third through eighth transistors are negative channel metal oxide semiconductor (NMOS) transistors. In addition, the ninth transistor M6 is a PMOS transistor, and the tenth transistor M7 and the eleventh transistor B3 are NMOS transistors.

Further, the twelfth through sixteenth transistors are PMOS transistors, and the seventeenth transistor F4 and the eighteenth transistor F3 are NMOS transistors.

The OP-amplifier 300 has a differential input structure in which a differential input terminal of the first differential input circuit consisting of the third transistor M11, the sixth transistor M22 and the eighth transistor M52, and a differential input terminal of the second differential input circuit consisting of the fourth transistor M12, the fifth transistor M21 and the seventh transistor M51, share the first and second transistors M3 and M4 of the mirror circuit such that they are cross-coupled with the first and second transistors M3 and M4.

In addition, the OP-amplifier 300 has an asymmetric transistor structure such that a channel width-to-length (W/L) ratio of the fourth and sixth transistors M12 and M22 is greater than a channel W/L ratio of the third and fifth transistors M11 and M21. Accordingly, a transconductance (gm) of the fourth and sixth transistors M12 and M22 is greater than a transconductance (gm) of the third and fifth transistors M11 and M21. The seventh and eighth transistors M51 and M52 act as current sources, are connected to the differential input transistors, and the first and second voltages BC1 and BC2, which act as control voltages for controlling a current amount, are fed back from the differential mode feedback circuit 306 to the gates of the seventh and eighth transistors M51 and M52.

The differential mode feedback circuit 306 includes a differential input terminal consisting of the fifteenth and sixteenth transistors F1 and F2. The input voltage Vin is input to the gate of the fifteenth transistor F1 and the output voltage Vout is input to the gate of the sixteenth transistor F2. A voltage difference between the input voltage Vin and the output voltage Vout causes a drain current difference flowing to the fifteenth and sixteenth transistors F1 and F2. A current changed by the drain current difference is converted into the first differential output voltage BC1 by a diode structure of the eighteenth transistor F3, such that a drain voltage of the seventeenth transistor F4 becomes the second differential output voltage BC2.

The output unit 304 has a structure in which the tenth transistor M7 acts as an active load and the ninth transistor M6 operates as a common source amplifier. The first and third capacitors Cc1 and Cc2, which act as mirror capacitors, are components for frequency compensation. In addition, the twelfth transistor B1 and the tenth transistor M7 form a bias circuit with a current mirror structure.

When the output unit 304 is designed, the OP-amplifier 300 is an open loop, and channel W/L ratios of the ninth and tenth transistors M7 and M6 are adjusted such that the output voltage Vout becomes Vdd/2 when a positive input voltage Vin+ and a negative input voltage Vin− of the OP-amplifier 300 are Vdd/2 in order to prevent a systematic voltage offset. Further, a bias current flowing to the twelfth transistor B1 is the same as a bias current flowing to the differential mode feedback circuit 306.

In the OP-amplifier 300, the transistors of the first and second differential circuits, which are connected respectively to the two output terminals of the current mirror circuit, are different in size, and a negative feedback is performed using a voltage difference fed back by the differential mode feedback circuit 306. In addition, the input voltage Vin and the output voltage Vout, which are applied to the gates of the fifteenth and sixteenth transistors F1 and F2, and a voltage difference between the input voltage Vin and the output voltage Vout causes different currents to flow to the seventeenth and eighteenth transistors F4 and F3.

Further, the current difference causes a voltage change $V_{DS}$ in the seventeenth and eighteenth transistors F4 and F3 which is then input to the seventh and eighth transistors M51 and M52 to determine a tail current of the input unit 302.

Gate voltages of the seventh transistor M51 and the eighth transistor M52 increase or decrease conversely to each other according to the voltage difference between the input voltage Vin and the output voltage Vout. Accordingly, currents flowing to the fourth transistor M12 and the sixth transistor M22 increase or decrease. Because a transconductance (gm) between the fourth and sixth transistors M12 and M22 is greater than a transconductance (gm) between the third and fifth transistors M11 and M21, the current flowing to the sixth transistor M22 rather than the fourth transistor M12 greatly increases or decreases. Such a current difference causes a current difference between the first and second transistors M3 and M4 that changes a drain voltage of the second transistor M4. The drain voltage of the second transistor M4 is continuously changed until the input voltage Vin is equal to the output voltage Vout, and as a result, the output voltage Vout of the OP-amplifier 300 becomes equal to the input voltage Vin.

The operation of the OP-amplifier 300, when the output voltage Vout is greater than the input voltage Vin, will now be described. First, the differential mode feedback circuit 306 senses a voltage difference between the output voltage Vout and the input voltage Vin. Because the output voltage Vout is greater than the input voltage Vin, a voltage $V_{GS}$ of the sixteenth transistor F2 decreases and a current $I_{F2}$ flowing through the sixteenth transistor F2 decreases. Meanwhile, a current $I_{F1}$ flowing through the fifteenth transistor F1 increases.

Due to a current difference between the currents $I_{F2}$ and $I_{F1}$, the second differential output voltage BC2 is greater than the first differential output voltage BC1. Accordingly, a current $I_{M51}$ flowing through the seventh transistor M51 is greater than a current $I_{M52}$ flowing through the eighth transistor M52. The current $I_{M51}$ flowing through the seventh transistor M51 is a sum of a current $I_{M12}$ flowing through the fourth transistor M12 and a current $IM_{21}$ flowing through the fifth transistor M21. Because a transconductance ($gm_{M12}$) of the fourth transistor M12 is greater than a transconductance ($gm_{M21}$) of the fifth transistor M21, an increased amount of current flows to the fourth transistor M12 as compared to the fifth transistor M21. At this time, because a current flowing through the third transistor M11 decreases and a greater current flows to the fourth transistor M12, an amount of current flowing through the first transistor M3 increases. Further, as the amount of current flowing through the first transistor M3 increases, a gate voltage of the second transistor M4 decreases and an amount of current flowing through the second transistor M4 increases. Accordingly, a drain voltage of the second transistor M4 increases and a current flowing through the ninth transistor M6 that receives as its gate voltage the drain voltage of the second transistor M4 decreases.

In addition, as the amount of current flowing through the ninth transistor M6 decreases, the output voltage Vout decreases. As a result, due to the operation of the differential mode feedback circuit 306, the OP-amplifier 300 decreases a voltage potential of the output voltage Vout.

The operation of the OP-amplifier 300, when the output voltage Vout is lower than the input voltage Vin, will now be described. First, the differential mode feedback circuit 306 senses a voltage difference between the output voltage Vout and the input voltage Vin. Because the output voltage Vout is lower than the input voltage Vin, a voltage $V_{GS}$ of the fifteenth transistor F1 decreases and a current $I_{F1}$ flowing through the fifteenth transistor F1 decreases. Meanwhile, a current $I_{F2}$ flowing through the sixteenth transistor F2 increases.

Due to a current difference between the currents $I_{F2}$ and $I_{F1}$, the first differential output voltage BC1 is greater than the second differential output voltage BC2. Accordingly, a current $I_{M52}$ flowing through the eighth transistor M52 is greater than a current $I_{M52}$ flowing through the seventh transistor M51. The current $I_{M52}$ flowing through the eighth transistor M52 is a sum of a current $I_{M11}$ flowing through the third transistor M11 and a current $I_{M22}$ flowing through the sixth transistor M22. Because a transconductance ($gm_{M22}$) of the sixth transistor M22 is greater than a transconductance ($gm_{M11}$) of the third transistor M11, an increased amount of current flows to the sixth transistor M22 as compared to the third transistor M11. At this time, a current flowing through the third transistor M51 increases and a current flowing through the third transistor M11 increases, while an amount of current flowing through the fourth transistor M12 greatly decreases. Therefore, an amount of current flowing through the first transistor M3 decreases. As the amount of current flowing through the first transistor M3 decreases, a gate voltage of the second transistor M4 increases and an amount of current flowing to the second transistor M4 decreases. Accordingly, a drain voltage of the second transistor M4 decreases and an amount of current flowing through the ninth transistor M6 that receives as its gate voltage a drain voltage of the second transistor M4 increases.

In addition, as the amount of current flowing to the ninth transistor M6 increases the output voltage Vout increases. As a result, due to the operation of the differential mode feedback circuit 306, the OP-amplifier 300 increases a voltage potential of the output voltage Vout.

A differential mode voltage gain of the input unit 302 of the OP-amplifier 300 can be obtained using equation 1 shown below.

$$A_{vd,input\_stage} = -(gm_{(M21)} + gm_{(M22)}) \times (r_{o(M4)}//r_{o(M21)}//r_{o(M22)}) \quad (1)$$

Further, a differential mode voltage gain of the OP-amplifier 300 can be obtained using equation 2 shown below.

$$A_{vd} = (A_{vd,CMFB\_stage}) \times (A_{vd,input\_stage}) \times (A_{vd,output\_stage}) \quad (2)$$

As shown in equations 1 and 2, $A_{vd,CMFB\_stage}$ is a voltage gain of the differential mode feedback circuit 306, $A_{vd,input\_stage}$ is a voltage gain of the input unit 302, and $A_{vd,output\_stage}$ is a voltage gain of the output unit 304.

Figure 5A:
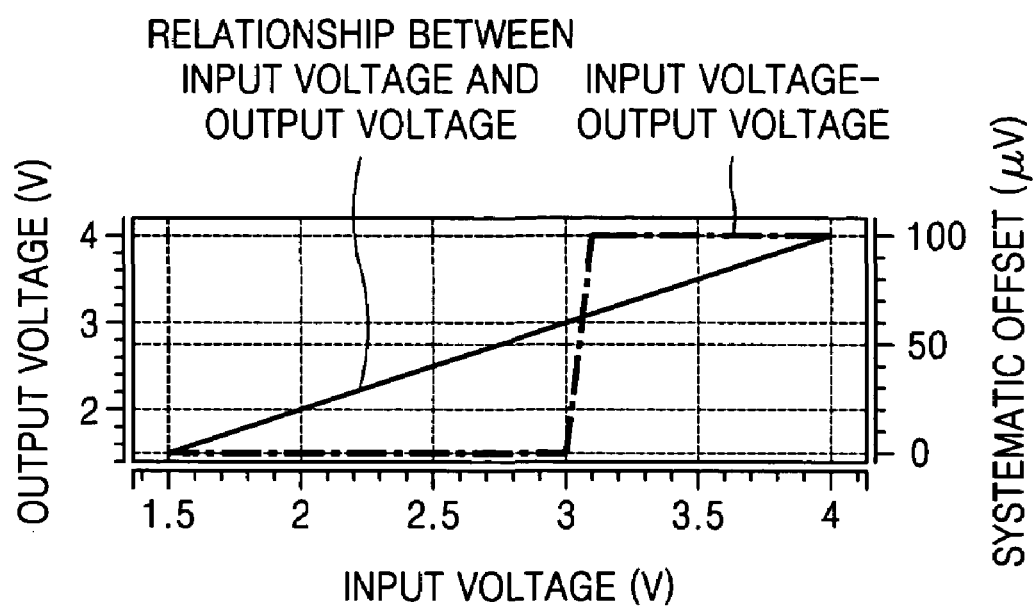
FIGS. 5a and 5b show simulation results for comparing an offset cancellation effect of the OP-amplifier according to an exemplary embodiment of the present invention with that of the conventional OP-amplifier.
Figure 5B:
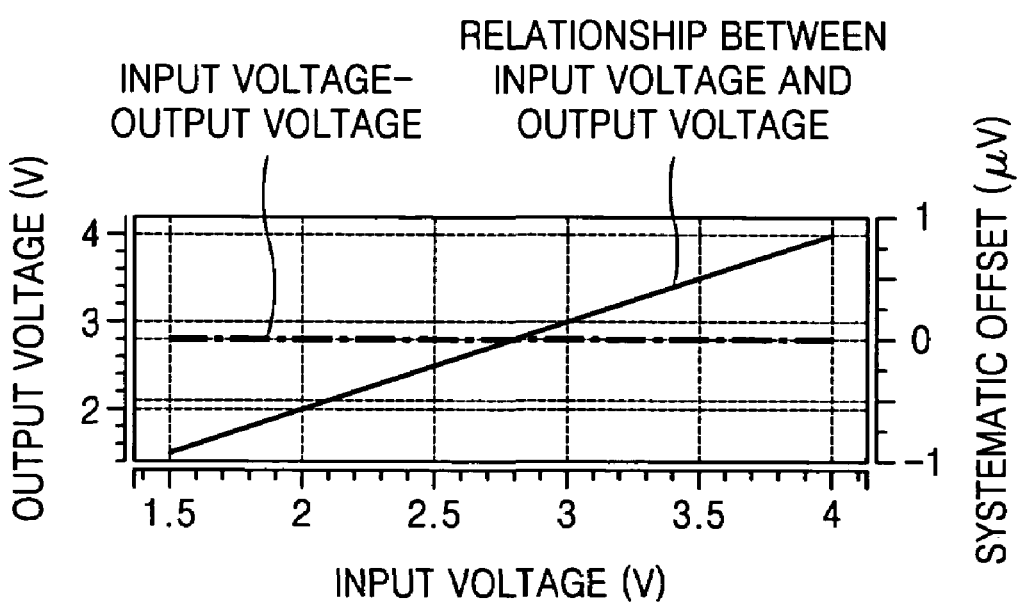

FIGS. 5a and 5b show simulation results for comparing an offset cancellation effect of the OP-amplifier according to an exemplary embodiment of the present invention with that of a conventional OP-amplifier.

In particular, FIG. 5a is a graph representing a systematic offset of the conventional OP-amplifier, and FIG. 5b is a graph representing a systematic offset of the OP-amplifier according to the present invention. In order to detect a total amount of the generated systematic offsets, the simulation is performed under a condition where all transistor pairs are matched and an input voltage is changed from 1.5 V to 4.0 V Referring to FIG. 5a, when the input voltage is changed from 1.5 V to 4 V, a voltage difference between an input voltage and an output voltage in the conventional OP-amplifier is 100 μV. However, referring to FIG. 5b, the OP-amplifier according to the present invention has an offset voltage of 0 µV in an operating voltage range of the OP-amplifier.

Figure 6A:
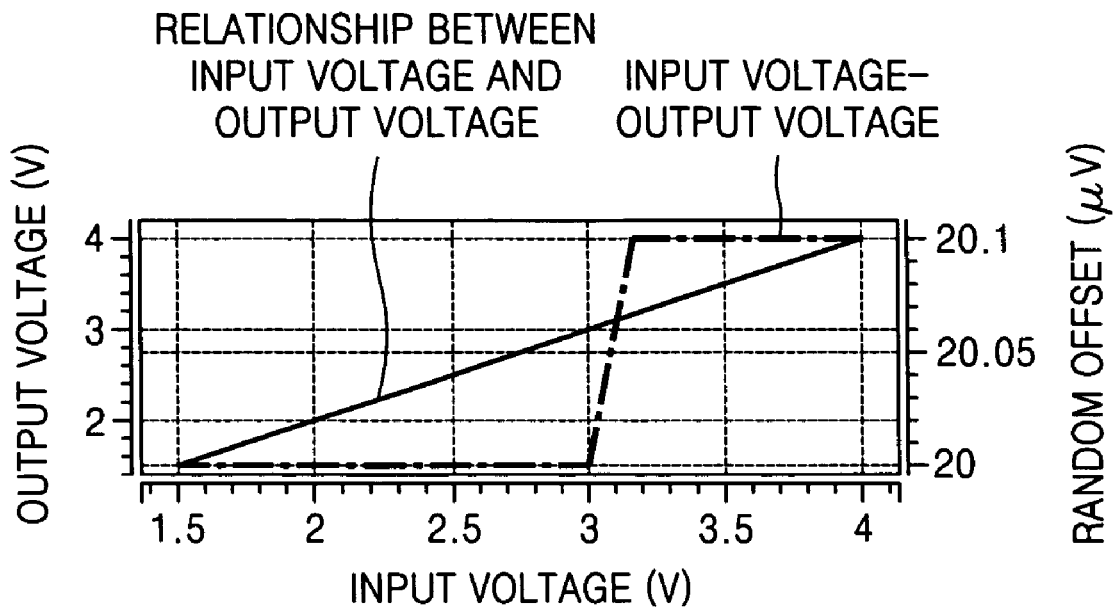
FIGS. 6a and 6b show simulation results for comparing a random offset cancellation effect of the OP-amplifier according to an exemplary embodiment of the present invention with that of the conventional OP-amplifier.
Figure 6B:
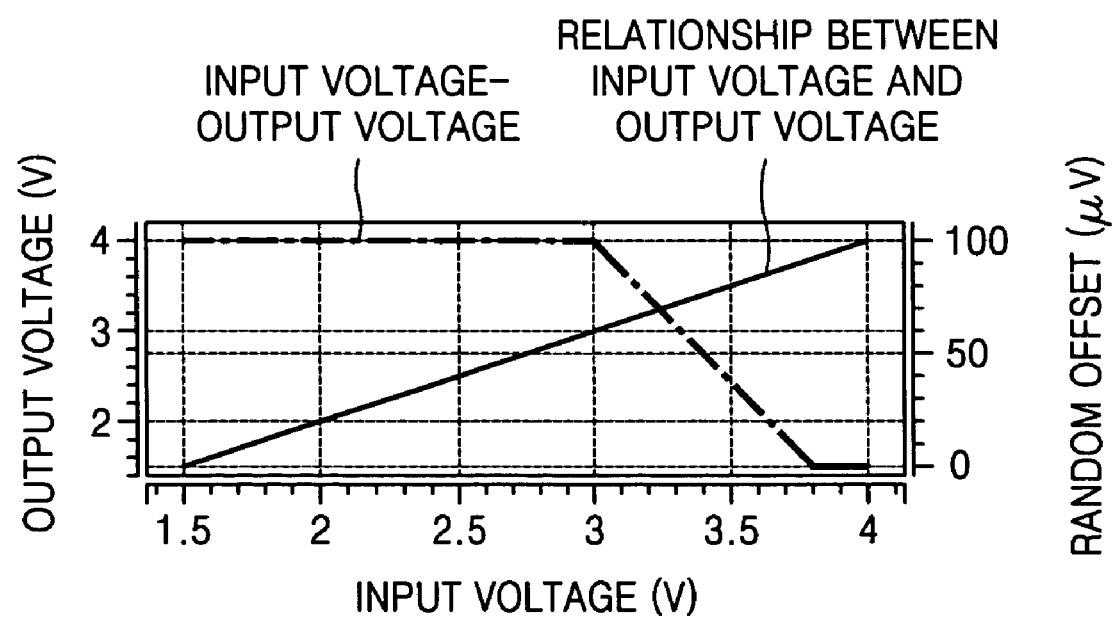

FIGS. 6a and 6b show simulation results for comparing a random offset cancellation effect of the OP-amplifier according to an exemplary embodiment of the present invention with that of a conventional OP-amplifier.

In particular, FIG. 6a is a graph representing a random offset of the conventional OP-amplifier, and FIG. 6b is a graph representing a random offset of the OP-amplifier according to the present invention. A factor, which has a significant influence on the random offset, is a mismatch of the transistor pairs in the input unit 302. In particular, a mismatch between threshold voltages Vth of the transistor pairs in the input unit 302 has the most significant influence on the random offset. Accordingly, the simulation is performed under a condition where only the transistor pairs in the input unit 302 have a mismatch between their threshold voltages Vth.

Referring to FIG. 6a, in the conventional OP-amplifier, when an input voltage is changed from 1.5 V to 4 V, a random offset voltage has a relatively large value of 20 mV through 20.1 mV. However, referring to FIG. 6b, the OP-amplifier according to the present invention has a relatively small random offset voltage of 100 µV through 0 µV. Thus, the OP-amplifier according to the present invention can operate very accurately because, for example, it has a small offset voltage in its operating voltage range. Therefore, the OP-amplifier according to the present invention can be used in ICs that are included in, for example, a TFT-LCD driver for high resolution applications employing a gray-scale of 10 bits.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An OP-amplifier comprising:
an input unit having a mirror circuit and first and second differential input circuits, wherein the mirror circuit has first and second output terminals, the first differential input circuit having a first bias circuit and the second differential input circuit having a second bias circuit;
an output unit for amplifying an output signal of the first and second differential input circuits; and
a differential mode feedback circuit for sensing a voltage difference between an output voltage and an input voltage applied to the first and the second differential input circuits, for outputting a first voltage and a second voltage based on the voltage difference, and for feeding back the first voltage to the first bias circuit and feeding back the second voltage to the second bias circuit to remove an offset voltage.

2. The OP-amplifier of claim 1, wherein the first bias circuit is controlled according to the first voltage output from the differential mode feedback circuit, and the second bias circuit is controlled according to the second voltage output from the differential mode feedback circuit.

3. The OP-amplifier of claim 2, wherein the first output terminal is connected to transistors in the first and second differential input circuits for sensing an output voltage of the OP-amplifier, and the second output terminal is connected to transistors in the first and second differential input circuits for sensing an input voltage of the OP-amplifier.

4. The OP-amplifier of claim 3, wherein a transconductance of a transistor connected to the first output terminal is smaller than a transconductance of a transistor connected to the second output terminal from the transistors of the first differential input circuit, and a transconductance of a transistor connected to the first output terminal is greater than a transconductance of a transistor connected to the second output terminal from the transistors of the second differential input circuit.

5. The OP-amplifier of claim 4, wherein a transconductance of a transistor of the first differential input circuit is smaller than a transconductance of a transistor of the second differential input circuit from the transistors connected to the first output terminal, and a transconductance of a transistor of the first differential input circuit is greater than a transconductance of a transistor of the second differential input circuit from the transistors connected to the second output terminal.

6. The OP-amplifier of claim 3, wherein a transistor connected to the first output terminal is smaller than a transistor connected to the second output terminal from the transistors of the first differential input circuit, wherein a channel width-to-length (W/L) ratio of the transistor connected to the first output terminal is smaller than a channel (W/L) ratio of the transistor connected to the second output terminal, and a transistor connected to the first output terminal is larger than a transistor connected to the second output terminal from the transistors of the second differential input circuit, wherein a channel (W/L) ratio of the transistor connected to the first output terminal is greater than a channel (W/L) ratio of the transistor connected to the second output terminal.

7. The OP-amplifier of claim 4, wherein a transistor of the first differential input circuit is smaller than a transistor of the second differential input circuit from the transistors connected to the first output terminal, wherein a channel (W/L) ratio of the transistor of the first differential input circuit is smaller than a channel (W/L) ratio of the transistor of the second differential input circuit, and a transistor of the first differential input circuit is larger than a transistor of the second differential input circuit from the transistors connected to the second output terminal, wherein a channel (W/L) ratio of the transistor of the first differential input circuit is greater than a channel (W/L) ratio of the transistor of the second differential input circuit.

8. The OP-amplifier of claim 1, wherein the input unit comprises:
a first transistor connected between a supply voltage and a first node;
a second transistor connected between the supply voltage and a second node;
a third transistor connected between the first node and a third node;
a fourth transistor connected between the first node and a fourth node;
a fifth transistor connected between the second node and the fourth node;
a sixth transistor connected between the second node and the third node;
a seventh transistor connected between the fourth node and a ground voltage; and
an eighth transistor connected between the third node and the ground voltage,
wherein gates of the first transistor and the second transistor are connected to the first node, an output voltage of the OP-amplifier is applied to gates of the third transistor and the fourth transistor, an input voltage of the OP-amplifier is applied to gates of the fifth transistor and the sixth transistor, and a differential output voltage of the differential mode feedback circuit is applied to gates of the seventh transistor and the eighth transistor, and the fourth transistor has a different current flow characteristic than the fifth transistor and the third transistor has a different current flow characteristic than the sixth transistor.

9. The OP-amplifier of claim 8, wherein the third transistor and the fifth transistor have the same current flow characteristics, the fourth transistor and the sixth transistor have the same current flow characteristics, and an amount of current flowing through the third and fifth transistors is less than an amount of current flowing through the fourth and sixth transistors.

10. The OP-amplifier of claim 9, wherein the first and second transistors are positive channel metal oxide semiconductor (PMOS) transistors and the third through eighth transistors are negative channel metal oxide semiconductor (NMOS) transistors.

11. The OP-amplifier of claim 8, wherein the output unit comprises:
a ninth transistor connected between the supply voltage and a fifth node;
a first capacitor connected between the second node and the fifth node;
a second capacitor and a tenth transistor connected in parallel between the fifth node and the ground voltage;
an eleventh transistor connected between a sixth node and the ground voltage; and
a third capacitor connected between the fifth node and a gate of the seventh transistor of the input unit,
wherein a gate of the ninth transistor is connected to the second node, gates of the tenth transistor and the eleventh transistor are connected to the sixth node, and the output voltage of the OP-amplifier is applied to the fifth node.

12. The OP-amplifier of claim 11, wherein the ninth transistor is a PMOS transistor and the tenth transistor and the eleventh transistor are NMOS transistors.

13. The OP-amplifier of claim 11, further comprising a bias circuit with two output terminals connected to the sixth node and a seventh node,
wherein the bias circuit comprises:
a twelfth transistor connected to the supply voltage and an eighth node;
a thirteenth transistor connected to the supply voltage and the seventh node; and
a fourteenth transistor connected to the supply voltage and the sixth node,
wherein gates of the twelfth transistor, the thirteenth transistor, and the fourteenth transistor are connected to the eighth node.

14. The OP-amplifier of claim 13, wherein the twelfth through fourteenth transistors are PMOS transistors.

15. The OP-amplifier of claim 13, wherein the differential mode feedback circuit comprises:
a fifteenth transistor connected between the seventh node and a ninth node;
a sixteenth transistor connected between the seventh node and a tenth node;
a seventeenth transistor connected between the ninth node and the ground voltage; and
an eighteenth transistor connected between the tenth node and the ground voltage,
wherein the input voltage of the OP-amplifier is applied to a gate of the fifteenth transistor, the output voltage of the OP-amplifier is connected to a gate of the sixteenth transistor, gates of the seventeenth transistor and the eighteenth transistor are connected to the tenth node, the ninth node is connected to a gate of the seventh transistor of the input unit, and the tenth node is connected to a gate of the eighth transistor of the input unit.

16. The OP-amplifier of claim 15, wherein the fifteenth transistor and the sixteenth transistor are PMOS transistors and the seventeenth transistor and the eighteenth transistor are NMOS transistors.

17. An OP-amplifier comprising:
an input circuit including two differential amplifiers each having an asymmetric structure for sensing a difference between an input signal and an output signal of the OP-amplifier, wherein each of the two differential amplifiers includes a current source;
an output circuit for amplifying an output signal of the input circuit and for generating an amplified result as the output signal of the OP-amplifier; and
a differential mode feedback circuit for sensing a difference between the input signal and the output signal of the OP-amplifier and for feeding back a sensed result to a current source of each of the two differential amplifiers of the input circuit to remove an offset.

18. An OP-amplifier comprising:
a first differential amplifier including two transistors with an asymmetric structure and a first current source connected to a common node of the two transistors for sensing and amplifying a voltage difference between an input voltage and an output voltage;
a second differential amplifier connected in parallel to the first differential amplifier, including two transistors with an asymmetric structure and a second current source connected to a common node of the two transistors for sensing and amplifying a voltage difference between the input voltage and the output voltage;
an output circuit for amplifying an output signal of a common connection node of the first differential amplifier and the second differential amplifier and for generating a first amplified result as the output voltage; and
a differential mode feedback circuit for sensing and amplifying a difference between the input voltage and the output voltage and for outputting a second amplified result through corresponding output terminals,
wherein at least one of the corresponding output terminals is connected to a control gate of the first current source and at least one of the corresponding output terminals is connected to a control gate of the second current source.

19. The OP-amplifier of claim 18, wherein the second amplified result is used to remove an offset voltage.

* * * * *